US008775104B2

(12) United States Patent
Marti

(10) Patent No.: US 8,775,104 B2
(45) Date of Patent: Jul. 8, 2014

(54) METHOD AND SYSTEM FOR PROTECTING AN ELECTRICAL POWER TRANSMISSION NETWORK

(75) Inventor: Jose R. Marti, Vancouver (CA)

(73) Assignee: Jose R. Marti, Vancouver, British Columbia (CA)

( * ) Notice: Subject to any disclaimer, the term of this patent is extended or adjusted under 35 U.S.C. 154(b) by 584 days.

(21) Appl. No.: 12/808,659

(22) PCT Filed: Dec. 17, 2008

(86) PCT No.: PCT/CA2008/002222
§ 371 (c)(1),
(2), (4) Date: Sep. 3, 2010

(87) PCT Pub. No.: WO2009/076769
PCT Pub. Date: Jun. 25, 2009

(65) Prior Publication Data
US 2010/0324844 A1 Dec. 23, 2010

Related U.S. Application Data

(60) Provisional application No. 61/006,056, filed on Dec. 17, 2007.

(51) Int. Cl.
*G01R 21/133* (2006.01)
*G01R 19/25* (2006.01)
(52) U.S. Cl.
CPC .......... *G01R 21/133* (2013.01); *G01R 19/2513* (2013.01)
USPC .......................................................... 702/61
(58) Field of Classification Search
CPC ........................... G01R 21/133; G01R 19/2513
USPC ............................................................ 702/61
See application file for complete search history.

(56) References Cited

U.S. PATENT DOCUMENTS 2,584,765 A * 2/1952 Warrington ...................... 361/80
3,883,724 A * 5/1975 Pradhan et al. .................... 703/3
(Continued)

FOREIGN PATENT DOCUMENTS

WO 2005/062438 7/2005

OTHER PUBLICATIONS

Grigsby, L.L. "Power System Analysis and Simulation" The Electric Power Engineering Handbook, Ed. L.L. Grigsby, Boca Raton: CRC Press LLC, 2001, pp. 1-62.*

(Continued)

*Primary Examiner* — Jonathan C Teixeira Moffat
*Assistant Examiner* — Regis Betsch
(74) *Attorney, Agent, or Firm* — Klarquist Sparkman, LLP

(57) ABSTRACT

A method and system for protecting an electrical power transmission network comprising the steps of: measuring a voltage and a current at a first location in the network other than at a generator in the network; determining positive and negative sequence voltages and currents based on the measured voltage and measured current; determining a negative sequence Thévenin impedance based on the negative sequence measured voltage and negative sequence measured current; defining a positive sequence Thévenin impedance as equal to the negative sequence Thévenin impedance; determining a Thévenin voltage based on the positive sequence measured voltage, positive sequence measured current and the positive sequence Thévenin impedance; determining a load impedance based on the positive sequence measured voltage and positive sequence measured current; and determining the stability of the network using the load impedance and one or more of the Thévenin voltage and positive sequence Thévenin impedance.

18 Claims, 6 Drawing Sheets

(56) References Cited

U.S. PATENT DOCUMENTS

| | | | |
|---|---|---|---|
| 4,641,088 | A | 2/1987 | Jacobsson |
| 5,631,569 | A | 5/1997 | Moore et al. |
| 5,661,664 | A * | 8/1997 | Novosel et al. ............... 700/293 |
| 6,219,591 | B1 | 4/2001 | Vu et al. |
| 6,249,719 | B1 | 6/2001 | Vu et al. |
| 6,518,767 | B1 | 2/2003 | Roberts et al. |
| 6,690,175 | B2 | 2/2004 | Pinzon et al. |
| 6,754,597 | B2 | 6/2004 | Bertsch et al. |
| 6,930,507 | B2 | 8/2005 | Dreps et al. |
| 7,154,981 | B2 | 12/2006 | Tokuhiro et al. |
| 2002/0123849 | A1* | 9/2002 | Quaintance et al. ............ 702/60 |
| 2007/0041137 | A1* | 2/2007 | Thompson ..................... 361/85 |

OTHER PUBLICATIONS

Schweitzer et al., "Introduction to Symmetrical Components", 2004, Schweitzer Engineering Laboratories pp. 1-15; http://chettinadtech.ac.in/g_articlen/10-06-18/10-06-18-09-46-00-bresnav.pdf.*

International Search Report and Written Opinion of the International Searching Authority, mailed Mar. 20, 2009, for corresponding International Application No. PCT/CA2008/002222.

Feng et al., "Identification of Voltage Collapse Through Direct Equilibrium Tracing," *IEEE Transactions on Power Systems*, vol. 15, No. 1, pp. 342-349, Feb. 2000.

Gao et al., "Towards the Development of a Systematic Approach for Voltage Stability Assessment of Large-Scale Power Systems," *IEEE Transactions on Power Systems*, vol. 11, No. 3, pp. 1314-1324, Aug. 1996.

Timbus, Adrian, "Grid Monitoring and Advanced Control of Distributed Power Generation Systems," Aalborg University, Institute of Energy Technology, Denmark, 234 pages, May 2007.

Van Cutsem et al., "A Comprehensive Analysis of Mid-Term Voltage Stability," *IEEE Transactions on Power Systems*, vol. 10, No. 3, pp. 1173-1182, Aug. 1995.

Van Cutsem and Vournas, "Voltage Stability Analysis in Transient and Mid-Term Time Scales," *IEEE Transactions on Power Systems*, vol. 11, No. 1, pp. 146-154, Feb. 1996.

Van Cutsem, Thierry "Voltage Instability: Phenomena, Countermeasures, and Analysis Methods," *Proceedings of the IEEE*, vol. 88, No. 2, pp. 208-227, Feb. 2000.

Venkatesh et al., "A New Optimal Reactive Power Scheduling Method for Loss Minimization and Voltage Stability Margin Maximization Using Successive Multi-Objective Fuzzy LP Technique," *IEEE Transactions on Power Systems*, vol. 15, No. 2, pp. 844-851, May 2000.

Warland and Holen, "Estimation of Distance to Voltage Collapse: Testing an Algorithm Based on Local Measurements," 14th PSCC Conference, Sevilla, Session 38, Paper 3, pp. 1-7, Jun. 24-28, 2002.

* cited by examiner

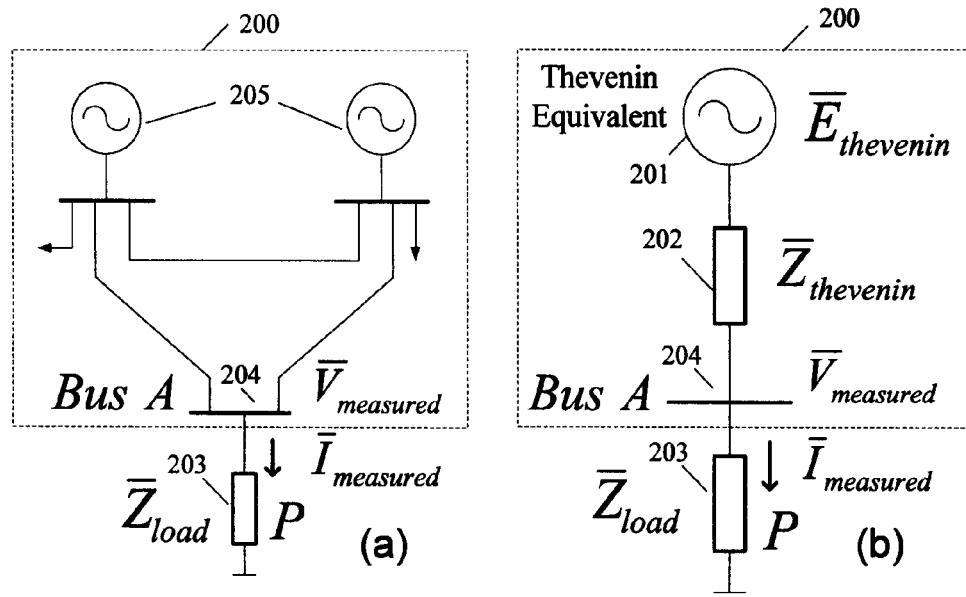
Fig. 2(a)
Fig. 2(b)
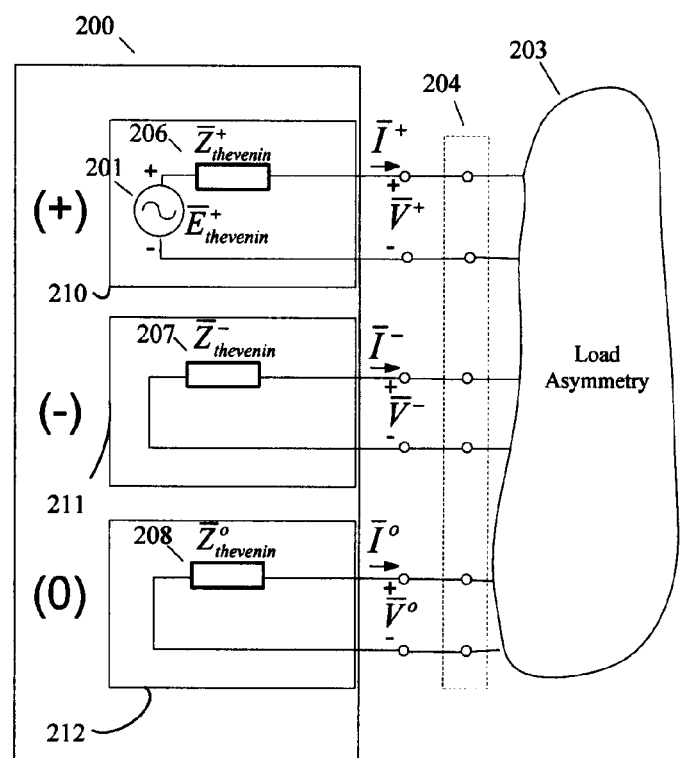
Fig. 2(c)

Table 5

| Point | Phase Voltages V(pu) | Active Power P(pu) | Thévenin Imped. Zth (pu) | Load Imped. Zload (pu) | Stability Indicator Zload/Zth |
|---|---|---|---|---|---|
| a | 0.9463 | 0.4040 | 0.3947 | 2.1833 | 5.5315 |
| b | 0.9320 | 0.5040 | 0.3947 | 1.7107 | 4.3342 |
| c | 0.9106 | 0.6040 | 0.3947 | 1.3558 | 3.4350 |
| d | 0.8900 | 0.7040 | 0.3947 | 1.1043 | 2.7978 |
| e | 0.8580 | 0.8040 | 0.3947 | 0.9013 | 2.2835 |
| f | 0.8160 | 0.9000 | 0.3947 | 0.7260 | 1.8394 |
| g | 0.7744 | 0.9680 | 0.3947 | 0.6093 | 1.5437 |
| h | 0.7215 | 1.0160 | 0.3947 | 0.5028 | 1.2739 |
| i | 0.6712 | 1.0440 | 0.3947 | 0.3935 | 0.9970 |
| j | 0.5707 | 1.0200 | 0.3947 | 0.3148 | 0.7976 |

Load Imbalance = 1.5%, Load power factor = 0.98 lagging; Sbase = 250 MVA; Vbase = 230 kV at the transmission level. Eth = 1.0 with zero degrees.

Table 6
(data for point operating point b in Table 5)

| | 1 | 2 Magnitude (pu) | 3 Phase (degrees) | 4 Va/Ia Vb/Ib Vc/Ic (magnitude pu) | 5 Va/Ia Vb/Ib Vc/Ic (degrees) |
|---|---|---|---|---|---|
| 1 | Va(pu) | 0.9312 | -11.68 | 1.6932 | 10.00 |
| 2 | Vb(pu) | 0.9320 | -131.56 | 1.7108 | 9.99 |
| 3 | Vc(pu) | 0.9329 | -251.44 | 1.7287 | 9.98 |
| | | | | Vzero/(-Izero) Vpos/Ipos Vneg/(-Ineg) (magnitude pu) | Vzero/(-Izero) Vpos/Ipos Vneg/(-Ineg) (degrees) |
| 4 | Vzero(pu) | 0.0012 | -154.86 | 0.3947 | 89.55 |
| 5 | Vpos(pu) | ■ | -11.56 | ■ | 9.99 |
| 6 | Vneg(pu) | 0.0012 | -95.49 | ■ | 89.55 |
| 7 | Ia(pu) | 0.5500 | -21.68 | | |
| 8 | Ib(pu) | 0.5448 | -141.55 | | |
| 9 | Ic(pu) | 0.5396 | -261.42 | | |
| 10 | Izero(pu) | 0.0030 | -64.41 | | |
| 11 | Ipos(pu) | 0.5448 | -21.55 | | |
| 12 | Ineg(pu) | 0.0030 | -5.04 | | |

Figure 6

METHOD AND SYSTEM FOR PROTECTING AN ELECTRICAL POWER TRANSMISSION NETWORK

CROSS REFERENCE TO RELATED APPLICATIONS

This is the U.S. National Stage of International Application No. PCT/CA2008/002222, filed Dec. 17, 2008, which in turn claims the benefit of U.S. Provisional Application No. 61/006,056, filed Dec. 17, 2007. The provisional application is incorporated herein in its entirety.

FIELD OF INVENTION

The present invention relates to electrical power transmission networks, and more particularly, to a method and system for protecting an electrical power transmission network.

BACKGROUND OF THE INVENTION

In the last thirty years, separate electrical power transmission networks within and across countries have been linked together. As a result of deregulation, these linked networks now handle large power transfers across long distances as power is bought and sold in a deregulated market. While these linked networks provide many advantages, they also expose a larger number of users to a larger number of potential sources of network problems.

In order to protect users from network problems the monitoring of network stability is crucial. Instability can cause brown outs (low voltage conditions) or black outs (complete loss of power) to a portion or all of the network. Instability can result when loads (e.g. power required by a defined group of users) on the network increase unexpectedly, transmission lines are reduced in power carrying capacity, generators go offline, or transformers at generator, transmission, or distribution substations are reduced in power conversion capacity. Instability can take various forms such as voltage dips, frequency shifts, or phase changes which can last from milliseconds up to tens of seconds. Minimizing the propagation of instability across the network is crucial to providing continuous power to industrial, commercial, educational, residential and other users.

Network operators typically monitor the status of the network at various network locations. The amplitude, phase and frequency of the voltages and currents at these locations are measured in order to (a) identify problems before they occur so that a failing piece of equipment can be taken off-line, and (b) detect instability so that a small part of the network can be disconnected in order to reduce the load on the remaining generation or transmission capacity (known as "load shedding"). When the conditions giving rise to network problems are poorly understood, operators may shed more load than necessary causing a wider black out than needed, or they may be unable to isolate the problem such that the problem may spread across the network causing a widespread black out. Recent blackouts include the August 2003 cascading blackout that affected Ontario, Canada, the US Midwest, and the US Northeast. It has been estimated that the August 2003 blackout has an economic cost of between $6 and $10 billion.

One approach to protecting the network is to assess the stability of the network by determining a Thévenin equivalent of the network at particular substation buses in the network as seen from the bus. The Thévenin equivalent models the network as consisting of a Thévenin voltage and a Thévenin impedance that are connected in series to the bus and a load. Once determined, the Thévenin parameters can be utilized to determine the stability of the network at the particular substation bus and appropriate protective action can be taken.

The relationship between the Thévenin parameters is given by the following equation:

$$\overline{E}_{thevenin} - \overline{Z}_{thevenin} \times \overline{I}_{measured} = \overline{V}_{measured} \quad (1)$$

where,
$\overline{E}_{thevenin}$ is the Thévenin voltage,
$\overline{Z}_{thevenin}$ is the Thévenin impedance,
$\overline{I}_{measured}$ is the measured current passing through the bus, and
$\overline{V}_{measured}$ is the measured voltage at the bus.

The measured current, $\overline{I}_{measured}$, and measured voltage, $\overline{V}_{measured}$, are typically measured at the bus using current transformers and voltage transformers (not shown) that are usually installed at the substation housing the bus for use with overcurrent protection and other standard relays.

Equation 1 consists of two known values, $\overline{I}_{measured}$ and $\overline{V}_{measured}$, and two unknown Thévenin parameters, $\overline{E}_{thevenin}$ and $\overline{Z}_{thevenin}$. In order to solve for the two Thévenin parameters, previous solutions require two or more measurements of the measured current, $\overline{I}_{measured}$, and measured voltage, $\overline{V}_{measured}$, at different instants in time. These solutions assume that (a) the Thévenin parameters do not change between successive measurements of the measured current and measured voltage and (b) the measured current and measured voltage do change between successive measurements. The Thévenin parameters are then estimated and compared with the impedance of the load to assess the stability of the network at the bus. Because the time scale of voltage collapse in a network can be as short as a few seconds, the two measurements must be made very close to each other to protect the network from voltage collapse. However, when the measurements are made very close to each other, the differences in measured voltages and currents, particularly with respect to the phase angles, are usually not large enough to produce an accurate approximation of the Thévenin parameters. Further, if more time is allowed between measurements to improve the accuracy of the approximation, then the assumption that the Thévenin parameters do not change between successive measurements is less accurate and there is additional delay in taking protective action to address network instability.

BRIEF SUMMARY OF THE INVENTION

It is an objective of the present invention to overcome at least some of the deficiencies or problems in prior art approaches to protecting an electrical power transmission network.

According to one aspect of the invention, there is provided a method for protecting an electrical power transmission network comprises the steps of:
(a) measuring a voltage and a current at a first location in the network other than at a generator in the network, the first location having a load connected thereto;
(b) determining a positive sequence measured voltage and a negative sequence measured voltage based on the measured voltage;
(c) determining a positive sequence measured current and a negative sequence measured current based on the measured current;
(d) determining a negative sequence Thévenin impedance based on the negative sequence measured voltage and negative sequence measured current;
(e) defining a positive sequence Thévenin impedance as equal to the negative sequence Thévenin impedance;

(f) determining a Thévenin voltage based on the positive sequence measured voltage, positive sequence measured current and the positive sequence Thévenin impedance;

(g) determining a load impedance based on the positive sequence measured voltage and positive sequence measured current; and (h) determining the stability of the electrical power transmission network using the load impedance and one or more of the Thévenin voltage and positive sequence Thévenin impedance.

Additional steps to the method can include disconnecting the load when the network has a stability that does not meet a selected stability threshold. Additional steps to the method can further include disconnecting a load connected to a second location in the network when the network has a stability at the first location that does not meet a selected stability threshold.

The stability of the network can be determined by the ratio of the magnitude of the load impedance to the magnitude of the positive sequence Thévenin impedance, and wherein the network is unstable when the stability is outside a selected stability threshold.

The first location can be a substation or an independent power producer in the network.

According to another aspect of the invention, a system is provided for protecting an electrical power transmission network a meter and a processor. The meter is in electrical communication with a first location in the network other than at a generator in the network. The meter is operable to measure a voltage and a current at the first location, the first location having a load connected thereto. The processor is communicative with the meter to receive the measured voltage and measured current from the meter. The processor has a memory with statements and instructions stored therein for execution by the processor of the following steps:

(a) determining a positive sequence measured voltage and a negative sequence measured voltage based on the measured voltage;

(b) determining a positive sequence measured current and a negative sequence measured current based on the measured current;

(c) determining a negative sequence Thévenin impedance based on the negative sequence measured voltage and negative sequence measured current;

(d) defining a positive sequence Thévenin impedance as equal to the negative sequence Thévenin impedance;

(e) determining a Thévenin voltage based on the positive sequence measured voltage, positive sequence measured current and the positive sequence Thévenin impedance;

(f) determining a load impedance based on the positive sequence measured voltage and positive sequence measured current; and (g) determining the stability of the network using the load impedance and one or more of the Thévenin voltage and positive sequence Thévenin impedance.

The system can further comprise a breaker and the memory of the processor can contain further statements and instructions stored therein. The breaker is in electrical communication with the first location. The breaker is communicative with the processor and operable to disconnect the load from the network. The further statements and instructions stored in the memory for execution by the processor instruct the processor to instruct the breaker to disconnect the load from the network when the network has a stability that does not meet a selected stability threshold.

The system can further comprise a network controller and the memory of the processor can contain yet further statements and instructions stored therein. The network controller is communicative with the first location and a second location in the network. The network controller is operable to instruct the second location to disconnect a load connected to the second location when the network has a stability at the first location that does not meet a selected stability threshold. The further statements and instructions stored in the memory for execution by the processor instruct the processor to communicate to the network controller the stability of the network determined by the processor.

The stability of the network can be determined by the ratio of the magnitude of the load impedance to the magnitude of the positive sequence Thévenin impedance, and wherein the network is unstable when the stability is outside a selected stability threshold.

The first location can be a substation or an independent power producer in the network.

According to yet another aspect of the invention, a computer-readable medium is provided having statements and instructions stored therein for execution by a processor for protecting an electrical power transmission network. The processor carries out the steps of:

(a) receiving a measured voltage and a measured current measured at a first location in the network other than at a generator in the network, the first location having a load connected thereto;

(b) determining a positive sequence measured voltage and a negative sequence measured voltage based on the measured voltage;

(c) determining a positive sequence measured current and a negative sequence measured current based on the measured current;

(d) determining a negative sequence Thévenin impedance based on the negative sequence measured voltage and negative sequence measured current;

(e) defining a positive sequence Thévenin impedance as equal to the negative sequence Thévenin impedance;

(f) determining a Thévenin voltage based on the positive sequence measured voltage, positive sequence measured current and the positive sequence Thévenin impedance;

(g) determining a load impedance based on the positive sequence measured voltage and positive sequence measured current; and (h) determining the stability of the network using the load impedance and one or more of the Thévenin voltage and positive sequence Thévenin impedance.

The computer-readable medium can have further statements and instructions stored therein for execution by a processor to instruct a breaker to disconnect the load when the network has a stability that does not meet a selected stability threshold.

The computer-readable medium can have yet further statements and instructions stored therein for execution by a processor to communicate to a network controller the stability of the network determined by the processor.

The stability of the network can be determined by the ratio of the magnitude of the load impedance to the magnitude of the positive sequence Thévenin impedance, and wherein the network is unstable when the stability is outside a selected stability threshold.

The first location can be a substation or an independent power producer in the network.

BRIEF DESCRIPTION OF THE DRAWINGS

FIG. 2(a) is a diagram of a simplified electrical power transmission network having a substation bus is connected to multiple generators via multiple transmission paths;

FIG. 2(b) is diagram of a Thévenin equivalent of the network shown in FIG. 2(a);

FIG. 2(c) is a diagram of a positive sequence network, negative sequence network and zero sequence network of the Thévenin equivalent shown in FIG. 2(b);

FIG. 6 is table presenting additional data of the simulation described for FIG. 5.

DETAILED DESCRIPTION OF EMBODIMENTS OF THE INVENTION

The embodiments described herein relate to a method and system for protecting an electrical power transmission network. Particularly, the embodiments relate to a system that is installed at a location in the network and a method employed by the system that protects the network by determining the Thévenin equivalent of the network viewed from the location based upon a single measurement of the voltage and current at the location at a particular instant in time (hereinafter referred to as the "measured voltage" and the "measured current", respectively). The Thévenin equivalent is then used to determine the stability of the network at that instant in time. The system provides rapid and accurate determination of the stability of the network viewed from the location, permitting rapid and precise protective action to be taken.

Figure 1:
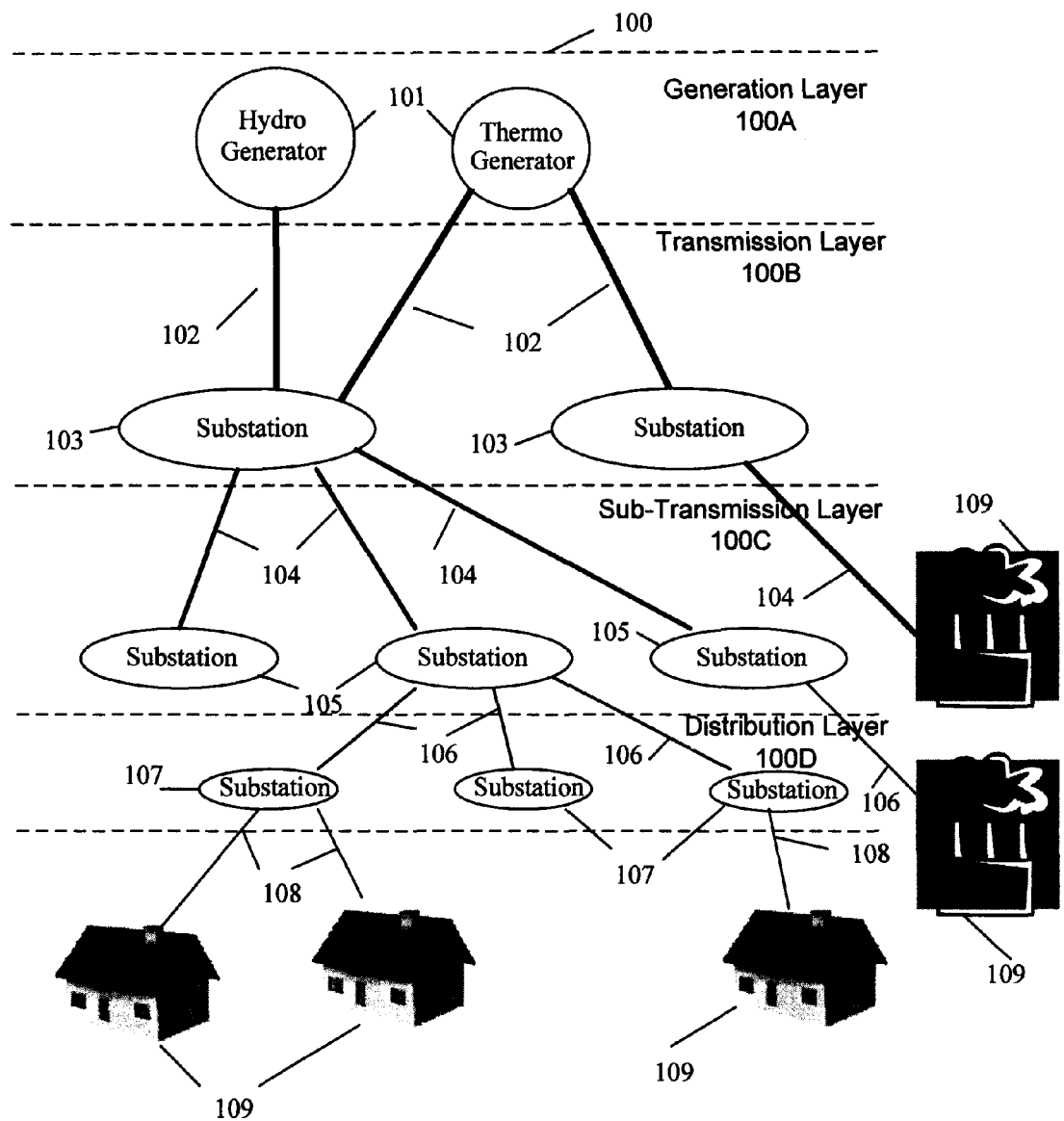
FIG. 1 is a diagram of a typical electrical power transmission network.

Referring to FIG. 1, a typical three-phase alternating-current (AC) electrical power transmission network 100 is shown. Network 100 may spread across a large geographical region with generation layers 100A, transmission layers 100B, sub-transmission layers 100C, distribution layers 100D, and utilization layers 100E. Generation layer 100A includes large power generators 101, such as hydro generators in dams and thermo generators in thermo power plants. Transmission layer 100B includes very high voltage lines 102 with voltages from approximately 115 kV to 750 kV that transmit power over distances of approximately 50 to 750 km to substations 103 that feed large urban areas, very large industrial plants, or connect with local networks. Sub-transmission layer 100C includes high voltage lines 104 with voltages from approximately 34.5 kV to 115 kV that transmit power over distances of approximately 10 to 50 km to substations 105 that feed urban areas, large industrial plants, or connect with local networks. Distribution layer 100D includes high voltage lines 106 with voltages of approximately 2.4 kV to 13.5 kV that transmit power over distances of approximately 1 to 10 km to substations 107 that feed residential neighbourhoods, schools, commercial centres, and other loads at voltages of 120V to 400 V. Distribution layer 100D can be broken down to primary distribution (7.2 kV to 13.5 kV) and secondary distribution (2.4 kV or less). Utilization loads 109 may be connected to the grid at various voltage levels. Substations at the generation layer 100A, transmission layer 100B, sub-transmission layer 100C, and primary distribution layer 100D typically also have the capability of shedding load by disconnecting lines or sub-networks.

The location in the network can be anywhere in the network other than at a generator in the network. In the preferred embodiment, preferably the location is at a substation in the network, for example, substations 103, 105 and 107.

In the network, the closer a point in the network is to the generators 101, typically, the more uniform and balanced the aggregate load will appear. However, as the point in the network moves closer to the actual loads 109, typically, the more dissimilar and imbalanced the aggregate load will appear.

Most loads 109 (e.g. residential loads and many commercial and industrial loads) are single-phase. That is, loads 109 may be connected to either phase a, phase b, or phase c of the three-phase AC network. In feeding power to an area of the network, care is taken to try to connect equal amounts of single-phase loads to each phase so as to achieve a balance between phases. A "balance" between loads on each phase may be achieved in a statistical sense by considering higher voltage layers, since these higher voltage layers feed a very large number of individual single-phase and three-phase loads 109. Typically, the phase imbalance is highest in the network near the connections to loads 109. For instance, typical currents imbalance levels between phases are 1.5 to 2.5% at transmission layer 100B, 3% at sub-transmission layer 100C, 5% at primary distribution layer, and 10 to 20% at secondary distribution layer 100D. The embodiments described herein utilize these imbalances to determine the Thévenin parameters of the network viewed from a location in the network and determine the stability of the network.

Figure 3:
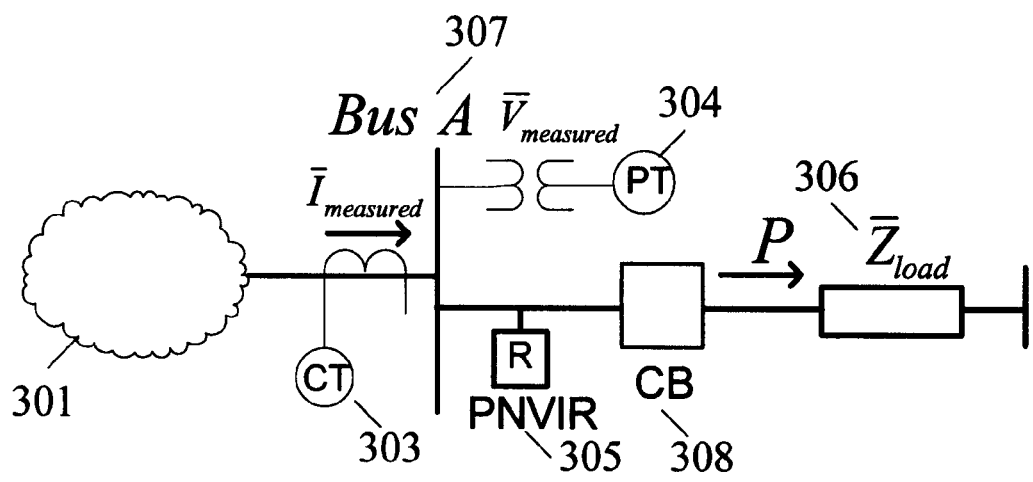
FIG. 3 is a diagram of a system for protecting an electrical power transmission network, according to one embodiment of the present invention.

Referring to FIG. 3, a system for protecting an electrical power transmission network is shown comprising a meter, a processor 305, and a breaker 308. The system is installed at a substation bus 307 in a network. The bus 307 is an intermediary that electrically connects the remainder of the network 301 to a load 306. In alternative, the system may be installed at other locations in the network.

The meter is in electrical communication with the bus 307. In the present embodiment, the meter comprises a current transformer 303 and a voltage transformer 304. The current transformer 303 is operable to measure all three phases of the current passing through a location in the network at a particular instant in time. Current transformers 303 are known in the art and may be for example an ABB IMB Current Transformer. The voltage transformer 304 is operable to measure all three phases of the voltage at a location in the network at a particular instant in time. Voltage transformers 304 are known in the art and may be for example an ABB EMF Inductive Voltage Transformer or an ABB CPA/CPB Capacitive Voltage Transformer. In the alternative, the meter may comprise any combination of measuring coils, optical measuring devices, digital measuring devices, or other devices operable to measure all three phases of the voltage and current at a location in the network at a particular instant in time.

The breaker 308 is operable to disconnect a particular load 306 from the network. Breakers 308 are known in the art and can be for example an ABB LTB Circuit Breaker.

The processor 305 is communicative with the meter and the breaker 308. The processor is operable to (a) receive voltage and current measurements from the meter, (b) determine the stability of the network based on a single voltage and current measurement, (c) determine whether to take protective action by comparing the determined stability with stability criteria, and (d) direct the breaker to take protective action if required. The processor comprises a memory containing statements and instructions stored therein for execution by the processor to determine the stability of the network, as further described below. In the present embodiment, the processor is a Schweitzer Engineering Laboratories programmable digital relay. In the alternative, the processor may comprise one or more general purpose computers, microcontrollers, application specific integrated circuits (ASIC), programmable logic controllers (PLC), digital signal processors (DSP), central processing units (CPU), or other devices know in the art capable of providing the functionality described above.

The processor 305 determines the stability of the network based on a single voltage and current measurement at a location in the network by (a) modelling the network as viewed from the location as a Thévenin equivalent and (b) analysing the Thévenin equivalent separately as a positive sequence network, a negative sequence network, and a zero sequence network. This method is further described below.

In alternative embodiments, the processor is communicative with a network controller. The network controller is operative to receive stability information from the processor and take protective action by disconnecting one or more loads connected at one or more locations in the network. The network controller may be configured to favour high priority loads in the network by disconnecting lower priority loads in preference to higher priority loads in order to maintain the stability of the network and provide high priority loads with uninterrupted power.

Thévenin Equivalent

To a high degree of manufacturing accuracy, three-phase generators generate balanced voltages in all three phases in the sequence abc. This sequence is known as the "positive sequence". To a high degree of accuracy, the magnitude of the generated voltages for phases a, b, and c are relatively close to each other (ideally identical) and their phase angles are relatively close to 120 degrees apart from each other. Even though the generator voltages of the three phases are balanced, loads connected to a three-phase network are typically not as well balanced. The existence of imbalance in a three-phase network results in voltages and currents in the network with the phase sequence acb. This sequence is known as the "negative sequence". This imbalance also results in voltages and currents in the network known as "zero sequence". The zero sequence voltages and currents are not assigned a phase sequence because they are zero degrees apart from each other. As discussed above, the level of load unbalance increases as the point in the network moves further from the generators. The load imbalance may become higher during transient system conditions or can be intentionally induced during tap changing of under-load tap changer transformers or by other similar devices, such as power electronic flexible AC transmission systems (FACTS) devices.

In a typical network, a substation may receive power from multiple generators through multiple transmission paths in the network. FIG. 2a illustrates such a network 200 having two generators 205 connected to a substation bus 204 having a load 203 attached thereto. For purposes of determining the stability of network 200, network 200 can be modelled as a Thévenin equivalent. Referring to FIG. 2b, the network 200 shown in FIG. 2a is modelled as its Thévenin equivalent having a single Thévenin voltage 201, $\overline{E}_{thevenin}$, and a single Thévenin impedance 202, $\overline{Z}_{thevenin}$ connected in series to the bus 204 and the load 203.

Referring to FIG. 2c, the Thévenin equivalent of network 200 can be separated into three networks representing its symmetrical components, comprising: (a) a positive sequence network 210, (b) a negative sequence network 211, and (c) a zero sequence network 212. The positive sequence network 210 consists of a positive sequence Thévenin impedance 206, $\overline{Z}_{thevenin}^{+}$ and a positive sequence Thévenin voltage 201, $\overline{E}_{thevenin}^{+}$. The negative sequence network 211 consists of a negative sequence impedance 207, $\overline{Z}_{thevenin}^{-}$ and the zero sequence network 212 consists of a zero sequence impedance 208, $\overline{Z}_{thevenin}^{0}$. The negative sequence and zero sequence networks 211, 212 do not contain voltage sources since a generator is only capable of producing positive sequence voltages.

The negative sequence and positive sequence voltage and current at a particular location in the network can be determined based on the measured voltage and measured current at the location. The measured voltage, $\overline{V}$measured, contains three phase voltages and the measured current, $\overline{I}$measured, contain three phase currents, represented in vector notation as follows:

$$\overline{V}_{measured} = [\overline{V}_a, \overline{V}_b, \overline{V}_c] \quad (2)$$

$$\overline{I}_{measured} = [\overline{I}_a, \overline{I}_b, \overline{I}_c] \quad (3)$$

where, $\overline{V}_a, \overline{V}_b, \overline{V}_c$ are the voltages for phases a, b and c, respectively, and $\overline{I}_a, \overline{I}_b, \overline{I}_c$ are the currents for phases a, b and c, respectively.

The positive and negative sequence measured voltages and currents can be determined from the measured voltage and measured current as follows:

$$\overline{V}^{-} = \frac{1}{3}[\overline{V}_a + a^2\overline{V}_b + a\overline{V}_c] \quad (4)$$

$$\overline{I}^{-} = \frac{1}{3}[\overline{I}_a + a^2\overline{I}_b + a\overline{I}_c] \quad (5)$$

$$\overline{V}^{+} = \frac{1}{3}[\overline{V}_a + a\overline{V}_b + a^2\overline{V}_c] \quad (6)$$

$$\overline{I}^{+} = \frac{1}{3}[\overline{I}_a + a\overline{I}_b + a^2\overline{I}_c] \quad (7)$$

where, a is an operator producing a 120 degree phase shift (a=1∠120°), $\overline{V}^{-}$ is the negative sequence measured voltage, $\overline{I}^{-}$ is the negative sequence measured current, $\overline{V}^{+}$ is the positive sequence measured voltage, and $\overline{I}^{+}$ is the positive sequence measured current.

Referring to FIG. 2c, the negative sequence network 211 consists of a negative sequence Thévenin impedance, $\overline{Z}_{thevenin}^{-}$. As discussed above, the negative sequence network does not contain a voltage source since a generator is only capable of producing positive sequence voltages. Thus, the negative sequence Thévenin impedance, $\overline{Z}_{thevenin}^{-}$, can be determined from the negative sequence measured voltage and current as follows:

$$\overline{Z}_{thevenin}^{-} = -\frac{\overline{V}^{-}}{\overline{I}^{-}} \quad (8)$$

In determining the impedance of a network, the impedance of generators in the network must be considered. A generator in a typical network has both a positive sequence impedance and a negative sequence impedance that are generally not equal (the positive sequence and negative sequence impedances of a generator are equal in the subtransient state of the generator). However, the difference between the positive sequence impedance and negative sequence impedance of a generator has only a small effect when compared to the total network impedance when viewed from a location in the network in either the transmission layer, sub-transmission layer, or distribution layer of a typical network. Thus, the negative sequence Thévenin impedance at a location in the network, $\overline{Z}_{thevenin}^{-}$, located in either the transmission layer, sub-transmission layer, or distribution layer of a typical network, can be approximated with a high degree of accuracy to be equal to the positive sequence impedance, $\overline{Z}_{thevenin}^{+}$. In addition, when the network is about to enter voltage instability, the sudden reaction of the network corresponds to the subtransient state of the generators. In the subtransient state, the generator reactance is basically identical to the negative sequence reactance of the generator, and as such, the negative sequence Thévenin impedance is basically identical to the positive sequence Thévenin impedance, even when the condition for voltage instability occurs close to the generators. Further, in the field of network stability analysis, when the Thévenin impedance is referred to, the reference is to the positive sequence Thévenin impedance.

Therefore, the Thévenin impedance can be determined based on the negative sequence measured voltage and current, expressed as follows:

$$\overline{Z}_{thevenin} = \overline{Z}_{thevenin}^{+} \approx \overline{Z}_{thevenin}^{-} = -\frac{\overline{V}^{-}}{\overline{I}^{-}} \qquad (9)$$

or $$\overline{Z}_{thevenin} \approx -\frac{\overline{V}^{-}}{\overline{I}^{-}} \qquad (10)$$

Referring to FIG. 2c, the positive sequence network 210 consists of a positive sequence Thévenin impedance 206, $\overline{Z}_{thevenin}^{+}$, and a positive sequence Thévenin voltage 201, $\overline{E}_{thevenin}^{+}$. The relationship between the positive sequence Thévenin voltage, the positive sequence impedance, and the positive sequence measured voltage and current can be expressed as follows:

$$\overline{E}_{thevenin}^{+} - \overline{Z}_{thevenin}^{+} \times \overline{I}^{+} = \overline{V}^{+} \qquad (11)$$

Similar to the Thévenin impedance, in the field of network stability analysis, when the Thévenin voltage is referred to, the reference is to the positive sequence Thévenin voltage. Thus, Equation 11 can be rewritten as follows:

$$\overline{E}_{thevenin} - \overline{Z}_{thevenin} \times \overline{I}^{+} = \overline{V}^{+} \qquad (12)$$

Combining Equations 10 and 12 provides the following relationship between Thévenin voltage, negative sequence measured voltage and current, and positive sequence measured voltage and current:

$$\overline{E}_{thevenin} \approx \overline{V}^{+} - \frac{\overline{V}^{-}}{\overline{I}^{-}} \times \overline{I}^{+} \qquad (13)$$

In the manner described above, the Thévenin impedance and Thévenin voltage of a network viewed from a location in the network can be determined from a single measurement of the voltage and current at the location.

Stability Analysis

Once the Thévenin voltage and Thévenin impedance are determined, the stability of the network can be determined. In the present embodiment, a stability indicator is compared to a stability threshold to determine the stability of the network. In alternative embodiments, other stability indicators know in the art are used to determine the stability of the network.

In alternative embodiments, other stability indicators know in the art are used to determine the stability of the network.

Referring to FIG. 2b, a stability indicator compares the load impedance 203 at a location in the network to the Thévenin impedance 202 of the network. The load impedance 203 can be determined from the positive sequence measured voltage and positive sequence measured current as follows:

$$\overline{Z}_{load} = \frac{\overline{V}^{+}}{\overline{I}^{+}} \qquad (14)$$

where $\overline{Z}_{load}$ is the load impedance at the location.

The stability indicator is defined as the ratio of the magnitudes of the load impedance 203 to the magnitude of the Thévenin impedance 202 as follows:

$$z_{ratio} = \frac{|\overline{Z}_{load}|}{|\overline{Z}_{thevenin}|} \geq 1 \qquad (15)$$

where $z_{ratio}$ is the ratio between the load impedance and Thévenin impedance.

The maximum power that can be supplied from network 200 to a substation bus 204 occurs when the magnitude of the load impedance 203 is equal to the magnitude of the Thévenin impedance 202. As long as the magnitude of the load impedance 203 is greater or equal to the magnitude of the Thévenin impedance 202, the network 200 is stable. The higher the ratio the more "stable" the network 200. Since only the magnitude of $\overline{Z}_{thevenin}$ is needed in Equation 15, the accuracy of the phase angle of voltages and currents in Equations 10 and 14 are not important.

Operation

Figure 4:
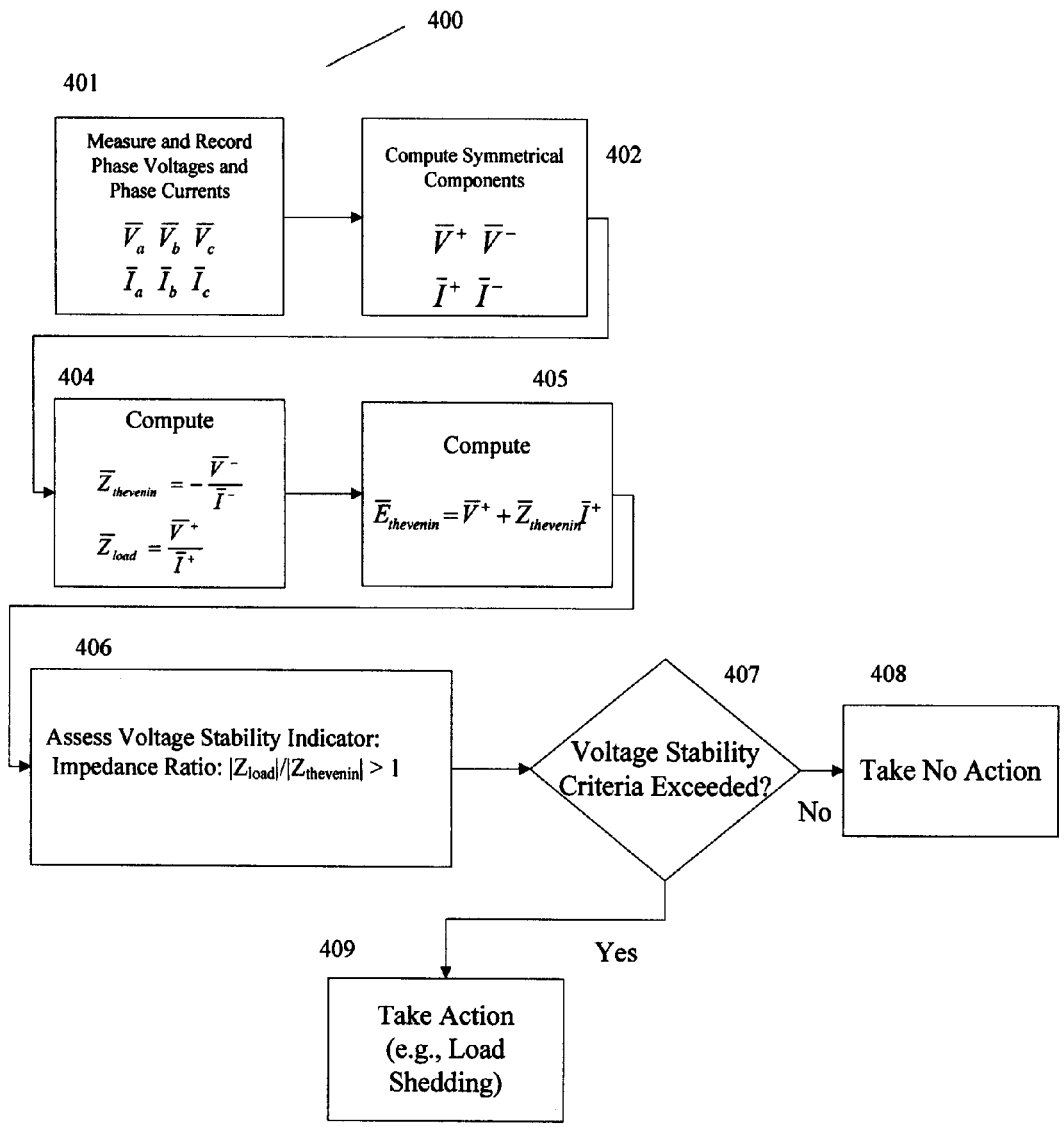
FIG. 4 is a process diagram of a method of protecting the stability electrical power transmission network, performed by the system shown in FIG. 3.

Referring to FIGS. 3 and 4, a system for protecting an electrical power transmission network and a method 400 depicting the operation of the system are shown.

In step 401, a single measurement of all three phases of the measured voltage and measured current is made by the meter at a particular instant in time. The measurement is made by the current transformer 303 and voltage transformer 304 and is communicated from the meter to the processor 305.

In step 402, the processor 305 determines the positive sequence voltage and current and the negative sequence voltage and current by solving Equations 4 to 6.

In step 404, the processor 305 determines the Thévenin impedance and load impedance by solving Equations 10 and 14, respectively.

In step 405, the processor 305 determines the Thévenin voltage by solving Equation 13.

In step 406, the processor determines the stability indicator by solving Equation 15.

In step 407, the stability indicator is compared against a stability threshold. If the stability indicator meets a selected stability threshold, the process advances to step 409 and the processor instructs the breaker 308 to disconnect the load 306 from the network or sends a signal to a network controller to disconnect some other load in some other location in the network. If the stability indicator does not meet the stability threshold, the process advances to step 408 and no action is taken. Steps 401 to 409 are then continuously repeated, thereby continuously determining the stability of the network and taking protective action when required.

In alternative embodiments, the determination of stability criteria and the determination of whether to take protective action is performed by a neural network algorithm or other decision making algorithms that have been trained with a large number of load and network operational conditions. In further alternative embodiments, the processor 305 may be programmed to make decisions as to how to address potential instability conditions. For example, in step 409, the processor 305 may make decisions on how much local or remote load should be disconnected (load shedding) to bring the local location in the network back to a safe operating zone.

In further alternative embodiments, the system may be utilized at a location in the network wherein an Independent Power Producer (IPP) is connection to the network. As described above, the system will determine the stability of the network and optionally disconnect the IPP if the network is determined to be unstable.

A person skilled in the art will recognize that the process described above may be used in a variety of other systems to detect a variety of other conditions. By way of non-limiting example, the process may be suitably modified for application to self-healing networks, load management, islanding detection and other active management techniques employed by grid operators and regulators to maintain grid stability.

EXAMPLE

Calculating the Voltage Stability Indicators

Figure 5:
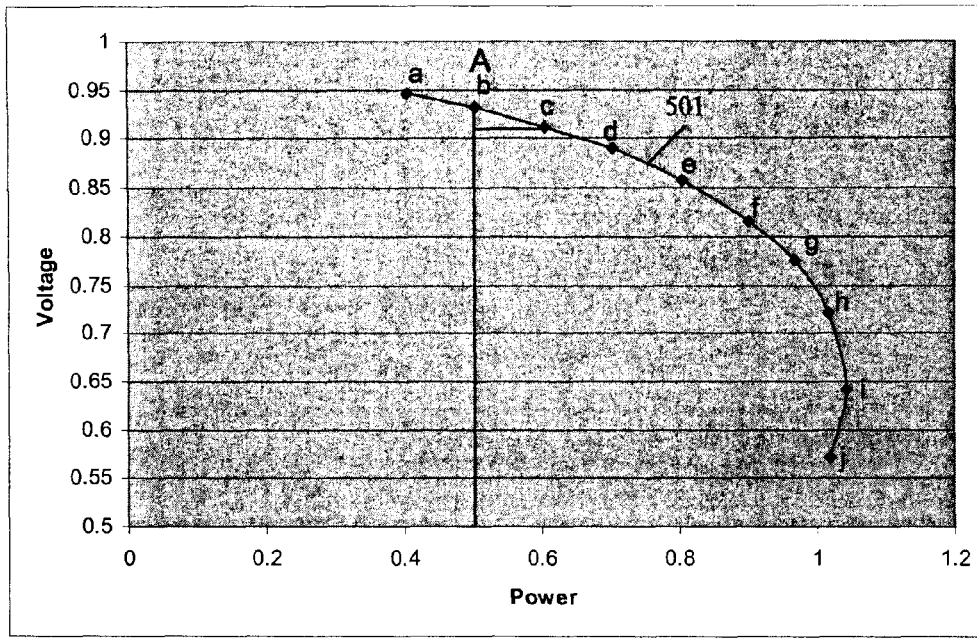
FIG. 5 is a graph and table presenting data of a simulation of the system shown in FIG. 3.

FIGS. 5 and 6 present data from computer-simulation of the network 200 shown in FIG. 2a. A simulated power-voltage (PV) curve 501 is shown in FIG. 5. The voltage in the PV curve 501 is the positive sequence measured voltage and the power is determined based on the positive sequence measured voltage and the positive sequence measured current. Operating points a, b, . . . j on PV curve 501 correspond to changing values of the active power, P, of load 203 on substation bus 204. Table 5 in FIG. 5 provides a number of computer-simulated quantities associated with operating points a, b, . . . j on PV curve 501. The simulation was conducted using a power factor (pf) at a constant 0.98 lagging for load 203 and an imbalance of 1.5% among load impedances connected to phase a, phase b, and phase c. Using circuit simulation, phase voltages and currents at the bus 204 were calculated (step 401). A symmetrical components transformation was then applied to obtain negative sequence and positive sequence voltages and currents using Equations 4 to 6 (step 402). The Thévenin impedance (column 4, Table 5) was determined using Equation 10 (step 404) and the Thévenin voltage was calculated as 1.0 pu with zero degrees angle using Equation 13 (step 405). Load impedance (column 5, Table 5) was then determined using Equation 14 (step 404). The stability indicator (column 6, Table 5) was then calculated using Equation 15. This process was repeated for load power values in increments of 10% (operating points a to j in FIG. 5). A detailed example of the numerical calculations for row b in Table 5 is shown in Table 6.

Table 6 in FIG. 6 shows computer simulated data which was used for the numerical results of operating point b of Table 5 (FIG. 5). The entries in rows 1, 2, 3 with columns 1, 2, 3 in Table 6 (FIG. 6) show computer simulated phase voltages and rows 7, 8, 9 with columns 1, 2, 3 show the simulated phase currents for the network in FIG. 2(a). Rows 4, 5, 6 with columns 1, 2, 3 show the calculated zero, positive, and negative sequence voltages and rows 10, 11, 12 with columns 1, 2, 3 show the calculated zero, positive, and negative sequence currents. The row corresponding to operating point b in Table 5 (FIG. 5) is obtained as follows. The phase voltage of 0.9320 pu (column 1) corresponds to row 5, column 2 in Table 6. Thévenin impedance of 0.3947 pu (column 3) is calculated with Equation 10 and corresponds to row 6, column 4 in Table 6. Thévenin voltage of 1.0 pu for all operating points a, b, . . . j can be verified with Equation 13. Load impedance of 1.7107 pu (column 4) is calculated with Equation 14 and corresponds to row 5, column 4 in Table 6. Active power P of 0.5040 pu (column 2) is calculated using the positive sequence measured voltage and positive sequence measured current. The stability indicator of 4.3342 pu (column 5) is calculated with Equation 15.

The invention claimed is:

1. A method for protecting an electrical power transmission network comprising the steps of:
    (a) measuring, at a particular instant in time, a voltage and a current at a first location in the network other than at a generator in the network, the first location having a load connected thereto, wherein measuring the voltage comprises measuring all phases of the voltage and measuring the current comprises measuring all phases of the current;
    (b) determining, from the measurements taken at the particular instant in time, a positive sequence measured voltage and a negative sequence measured voltage based on the measured voltage;
    (c) determining, from the measurements taken at the particular instant in time, a positive sequence measured current and a negative sequence measured current based on the measured current;
    (d) determining a negative sequence Thévenin impedance based on the negative sequence measured voltage and the negative sequence measured current;
    (e) defining a positive sequence Thévenin impedance as equal to the negative sequence Thévenin impedance;
    (f) determining a Thévenin voltage based on the positive sequence measured voltage, the positive sequence measured current and the positive sequence Thévenin impedance;
    (g) determining a load impedance based on the positive sequence measured voltage and the positive sequence measured current; and
    (h) determining the stability of the network using the load impedance and one or more of the Thévenin voltage and the positive sequence Thévenin impedance.

2. The method of claim 1, further comprising the step of disconnecting the load when the network has a stability that does not meet a selected stability threshold.

3. The method of claim 1, further comprising the step of disconnecting a load connected to a second location in the network when the network has a stability at the first location that does not meet a selected stability threshold.

4. The method of claim 1, wherein the stability of the network is determined by the ratio of the magnitude of the load impedance to the magnitude of the positive sequence Thévenin impedance, and wherein the network is unstable when the stability is outside a selected stability threshold.

5. The method of claim 1, wherein the first location is a substation in the network.

6. The method of claim 1, wherein the first location is an independent power producer in the network.

7. A system for protecting an electrical power transmission network comprising:
    (i) a meter in electrical communication with a first location in the network other than at a generator in the network, the meter operable to measure at a particular instant in time a voltage and a current at the first location, the first location having a load connected thereto, wherein the measured voltage comprises all phases of the voltage and the measured current comprises all phases of the current; and (j) a processor communicative with the meter to receive the measured voltage and measured current from the meter, the processor having a memory with statements and instructions stored therein for execution by the processor of the following steps:
  (i) determining a positive sequence measured voltage and a negative sequence measured voltage based on the measured voltage;
  (ii) determining, from the measurements taken at the particular instant in time, a positive sequence measured current and a negative sequence measured current based on the measured current;
  (iii) determining, from the measurements taken at the particular instant in time, a negative sequence Thévenin impedance based on the negative sequence measured voltage and the negative sequence measured current;
  (iv) defining a positive sequence Thévenin impedance as equal to the negative sequence Thévenin impedance;
  (v) determining a Thévenin voltage based on the positive sequence measured voltage, the positive sequence measured current and the positive sequence Thévenin impedance;
  (vi) determining a load impedance based on the positive sequence measured voltage and the positive sequence measured current; and
  (vii) determining the stability of the network using the load impedance and one or more of the Thévenin voltage and the positive sequence Thévenin impedance.

8. The system of claim 7, wherein:
(a) the system further comprises a breaker, the breaker in electrical communication with the first location, the breaker communicative with the processor and operable to disconnect the load from the network; and
(b) the memory of the processor contains further statements and instructions stored therein for execution by the processor to instruct the breaker to disconnect the load from the network when the network has a stability that does not meet a selected stability threshold.

9. The system of claim 7, wherein
(a) the system further comprises a network controller, the network controller communicative with the first location and a second location in the network, the network controller operable to instruct the second location to disconnect a load connected to the second location when the network has a stability at the first location that does not meet a selected stability threshold; and
(b) the memory of the processor contains further statements and instructions stored therein for execution by the processor to communicate to the network controller the stability of the network determined by the processor.

10. The system of claim 7, wherein the stability of the network is determined by the ratio of the magnitude of the load impedance to the magnitude of the positive sequence Thévenin impedance, and wherein the network is unstable when the stability is outside a selected stability threshold.

11. The system of claim 7, wherein the first location is a substation in the network.

12. The system of claim 7, wherein the first location is an independent power producer in the network.

13. A non-transitory computer-readable medium containing instructions which when executed by a processor causes the processor to carry out steps for protecting an electrical power transmission network, the steps comprising:
  (k) receiving a measured voltage and a measured current measured at a particular instant in time at a first location in the network other than at a generator in the network, the first location having a load connected thereto, wherein the measured voltage comprises all phases of the voltage and the measured current comprises all phases of the current;
  (l) determining, from the measurements taken at the particular instant in time, a positive sequence measured voltage and a negative sequence measured voltage based on the measured voltage;
  (m) determining, from the measurements taken at the particular instant in time, a positive sequence measured current and a negative sequence measured current based on the measured current;
  (n) determining a negative sequence Thévenin impedance based on the negative sequence measured voltage and the negative sequence measured current;
  (o) defining a positive sequence Thévenin impedance as equal to the negative sequence Thévenin impedance;
  (p) determining a Thévenin voltage based on the positive sequence measured voltage, the positive sequence measured current and the positive sequence Thévenin impedance;
  (q) determining a load impedance based on the positive sequence measured voltage and the positive sequence measured current; and
  (r) determining the stability of the network using the load impedance and one or more of the Thévenin voltage and the positive sequence Thévenin impedance.

14. The computer-readable medium of claim 13, further comprising statements and instructions stored therein for execution by a processor to instruct a breaker to disconnect the load when the network has a stability that does not meet a selected stability threshold.

15. The computer-readable medium of claim 13, further comprising statements and instructions stored therein for execution by a processor to communicate to a network controller the stability of the network determined by the processor.

16. The computer-readable medium of claim 13, wherein the stability of the network is determined by the ratio of the magnitude of the load impedance to the magnitude of the positive sequence Thévenin impedance, and wherein the network is unstable when the stability is outside a selected stability threshold.

17. The computer-readable medium of claim 13, wherein the first location is a substation in the network.

18. The computer-readable medium of claim 13, wherein the first location is an independent power producer in the network.

* * * * *